(12) United States Patent
Tonapi et al.

(10) Patent No.: US 7,022,410 B2
(45) Date of Patent: Apr. 4, 2006

(54) COMBINATIONS OF RESIN COMPOSITIONS AND METHODS OF USE THEREOF

(75) Inventors: Sandeep Shrikant Tonapi, Niskayuna, NY (US); John Campbell, Clifton Park, NY (US); Ryan Mills, Rexford, NY (US); Ananth Prabhakumar, Schenectady, NY (US); Slawomir Rubinsztajn, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 189 days.

(21) Appl. No.: 10/736,946

(22) Filed: Dec. 16, 2003

(65) Prior Publication Data

US 2005/0131106 A1    Jun. 16, 2005

(51) Int. Cl.
*B32B 27/38*    (2006.01)
*H01L 21/50*    (2006.01)
*C08L 63/00*    (2006.01)

(52) U.S. Cl. .................... 428/414; 428/413; 438/127; 523/440; 523/443

(58) Field of Classification Search .................... None
See application file for complete search history.

(56) References Cited

U.S. PATENT DOCUMENTS

| 6,121,689 | A | 9/2000 | Capote et al. |
| 6,297,560 | B1 | 10/2001 | Capote et al. |
| 6,335,571 | B1 | 1/2002 | Capote et al. |
| 6,399,426 | B1 | 6/2002 | Capote et al. |
| 6,518,677 | B1 | 2/2003 | Capote et al. |
| 6,566,234 | B1 | 5/2003 | Capote et al. |
| 2002/0089067 | A1 | 7/2002 | Crane et al. |
| 2003/0124378 | A1 | 7/2003 | Konarski et al. |
| 2003/0141592 | A1 | 7/2003 | Ma et al. |
| 2003/0164555 | A1 | 9/2003 | Tong et al. |
| 2003/0171456 | A1 | 9/2003 | Tong et al. |
| 2005/0049334 | A1 * | 3/2005 | Rubinsztain et al. ....... 523/456 |

FOREIGN PATENT DOCUMENTS

WO    WO 03/075338    12/2003

OTHER PUBLICATIONS

PCT International Search Report dated Mar. 31, 2005.

* cited by examiner

*Primary Examiner*—Michael J. Feely
(74) *Attorney, Agent, or Firm*—Shawn A. McClintic; William E. Powell, III

(57) ABSTRACT

A composition for use as underfill material is provided. The underfill material includes a first curable transparent resin composition and a second curable fluxing resin composition. The first curable resin composition includes at least one aromatic epoxy resin in combination with a solvent, a functionalized colloidal silica dispersion, and at least one other component selected from the group consisting of cycloaliphatic epoxy monomers, aliphatic epoxy monomers, hydroxy aromatic compounds and combinations and mixtures thereof, thereby forming a solvent-modified resin. The second curable fluxing composition includes at least one epoxy resin. The combination of the two resin compositions is useful in producing underfill materials and is suitable for use as an encapsulant for electronic chips.

17 Claims, No Drawings

COMBINATIONS OF RESIN COMPOSITIONS AND METHODS OF USE THEREOF

BACKGROUND OF THE INVENTION

The present disclosure relates to the use of a first curable resin composition in combination with a second curable fluxing resin composition in underfill materials. More specifically, the first curable resin composition includes a thermosetting resin, solvent and functionalized colloidal silica. The second curable fluxing resin composition preferably includes a thermosetting epoxy resin and optional additives. The final cured composition has a low coefficient of thermal expansion and a high glass transition temperature.

Demand for smaller and more sophisticated electronic devices continues to drive the electronic industry towards improved integrated circuit packages that are capable of supporting higher input/output (I/O) density as well as have enhanced performance at smaller die areas. While flip chip technology has been developed to respond to these demanding requirements, a weak point of the flip chip construction is the significant mechanical stress experienced by solder bumps during thermal cycling due to the coefficient of thermal expansion (CTE) mismatch between silicon die and substrate. This mismatch, in turn, causes mechanical and electrical failures of the electronic devices. Currently, capillary underfill is used to fill gaps between silicon chip and substrate and improve the fatigue life of solder bumps; however capillary underfill based fabrication processes introduce additional steps into the chip assembly process that reduce productivity.

Ideally, underfill resins would be applied at the wafer stage to eliminate manufacturing inefficiencies associated with capillary underfill. However, use of resins containing conventional fused silica fillers needed for low CTE is problematic because fused silica fillers obscure guide marks used for wafer dicing and also interfere with the formation of good electrical connections during solder reflow operations. Thus, in some applications improved transparency is needed to enable efficient dicing of a wafer to which underfill materials have been applied.

Moreover, a problem with the application of underfill resins at the wafer stage is the misalignment of chips which can occur after chip placement on a substrate. Without a means for holding a chip in place on a substrate or device, the chips can shift during the reflow operation and become misaligned. This misalignment is especially prevalent during transport operations of chip assemblies.

Thus, improved underfill materials having low CTE and improved transparency which are capable of reducing chip misalignment, and methods of their application, would be desirable.

BRIEF DESCRIPTION OF THE INVENTION

The present disclosure relates to the use of a combination of two resin compositions to form an underfill material. The first resin composition is transparent and comprises a curable resin in combination with a solvent and a filler of colloidal silica. Preferably the first curable resin is an aromatic epoxy resin, in combination with at least one additional component selected from the group consisting of cycloaliphatic epoxy monomers, aliphatic epoxy monomers, hydroxy aromatic compounds, and combinations and mixtures thereof. Once formed, this first solvent-modified resin is applied to a wafer or chip. Preferably, the resin utilized in the first resin composition forms a hard, transparent B-stage resin upon removal of solvent. Once the B-stage resin has formed, the chip is ready for placement on a substrate.

A second and distinct curable fluxing resin is applied to the substrate or device prior to placement of the chip. Preferably, the second curable fluxing composition is an epoxy resin. The addition of fluxing resin to the substrate holds the coated chip in place during reflow, thereby preventing misalignment during the interval between chip placement and reflow. Solder interconnects are formed during reflow, with enhanced fluxing of solder balls.

The combination of the first solvent-modified resin and the second curable fluxing resin utilized in the present disclosure forms a low CTE, high Tg thermoset resin upon curing.

DETAILED DESCRIPTION OF THE INVENTION

The present disclosure is related to a combination of resin materials that are useful as underfill materials. The underfill materials of the present disclosure include two resins: a first curable transparent resin composition, and a second curable fluxing resin composition. The first curable resin composition is preferably applied at the wafer stage, the resin B-staged by solvent removal and the wafer is then subjected to dicing or similar operations to produce individual chips. However, in some embodiments the first curable resin can be applied to an individual chip after dicing. The second curable fluxing resin is applied to the substrate or device to which the chip is to be applied. The second curable fluxing resin holds the chip in place during reflow operations, thereby limiting misalignment of the chip.

The first curable resin compositions of the present disclosure preferably include a resin matrix of at least one epoxy resin. Preferably, the first curable resin composition includes at least one aromatic epoxy resin and at least one cycloaliphatic epoxy resin, aliphatic epoxy resin, hydroxy aromatic compound, or mixtures or combinations thereof. The resin matrix is combined with at least one solvent and a particle filler dispersion. In one embodiment, the aromatic epoxy resin is an epoxy derived from novolac cresol resin. In another embodiment, the particle filler dispersion comprises at least one functionalized colloidal silica. The first curable resin composition may also include one or more hardeners and/or catalysts, among other additives. Upon heating and removal of solvent, the first curable resin forms a transparent B-stage resin, sometimes referred to herein as a "solvent-modified resin." The transparency of the first solvent-modified resin material is especially useful as a wafer level underfill, to render wafer dicing guide marks visible during wafer dicing operations.

The second curable fluxing resin compositions of the present disclosure preferably include a resin matrix of at least one epoxy resin. Preferably, the fluxing resin is a low viscosity liquid, and includes an epoxy hardener. In one embodiment, the second curable fluxing resin includes at least one fuctionalized colloidal silica.

The combination of the two resins produces underfill materials which are finally curable by heating to a cured, hard resin with low coefficient of thermal expansion ("CTE"), and high glass transition temperature ("Tg"). In certain embodiments, the underfill material can have self-fluxing capabilities. The colloidal silica filler is essentially uniformly distributed throughout the disclosed compositions, and this distribution remains stable at room temperature and during removal of solvent from the first curable resin and any curing steps.

"Low coefficient of thermal expansion" as used herein refers to a cured total composition with a coefficient of thermal expansion lower than that of the base resin as measured in parts per million per degree centigrade (ppm/° C.). Typically, the coefficient of thermal expansion of the cured total composition is below about 50 ppm/° C. "Cured" as used herein refers to a total formulation with reactive groups wherein between about 50% and about 100% of the reactive groups have reacted. "B-stage resin" as used herein refers to a secondary stage of thermosetting resins in which resins are typically hard and may have only partially solubility in common solvents. "Glass transition temperature" as referred to herein is the temperature as which an amorphous material changes from a hard to a plastic state. "Low viscosity of the total composition before cure" typically refers to a viscosity of the underfill material in a range between about 50 centipoise and about 100,000 centipoise and preferably, in a range between about 1000 centipoise and about 20,000 centipoise at 25° C. before the composition is cured. "Transparent" as used herein refers to a maximum haze percentage of 15, typically a maximum haze percentage of ten (10); and most typically a maximum haze percentage of three (3). "Substrate" as used herein refers to any device or component to which a chip is attached.

Suitable resins for use in the first curable transparent resin compositions include, but are not limited to epoxy resins, polydimethylsiloxane resins, acrylate resins, other organo-functionalized polysiloxane resins, polyimide resins, fluorocarbon resins, benzocyclobutene resins, fluorinated polyallyl ethers, polyamide resins, polyimidoamide resins, phenol cresol resins aromatic polyester resins, polyphenylene ether (PPE) resins, bismaleimide triazine resins, fluororesins and any other polymeric systems known to those skilled in the art which may undergo curing to a highly crosslinked thermoset material. (For common polymers, see "Polymer Handbook", Branduf, J.; Immergut, E. H; Grulke, Eric A; Wiley Interscience Publication, New York, 4th ed. (1999); "Polymer Data Handbook"; Mark, James, Oxford University Press, New York (1999)). Preferred curable thermoset materials are epoxy resins, acrylate resins, polydimethyl siloxane resins and other organo-fuctionalized polysiloxane resins that can form cross-linking networks via free radical polymerization, atom transfer, radical polymerization, ring-opening polymerization, ring-opening metathesis polymerization, anionic polymerization, cationic polymerization or any other method known to those skilled in the art. Suitable curable silicone resins include, for example, the addition curable and condensation curable matrices as described in "Chemistry and Technology of Silicone"; Noll, W., Academic Press (1968).

The epoxy resin utilized in the first resin composition is preferably an epoxy resin matrix including at least one aromatic epoxy resin and at least one cycloaliphatic epoxy monomer, aliphatic epoxy monomer, or hydroxy aromatic compound, or a mixture of any one of the above. The epoxy resins may further include any organic system or inorganic system with an epoxy functionality. When resins, including aromatic, aliphatic and cycloaliphatic resins are described throughout the specification and claims, either the specifically-named resin or molecules having a moiety of the named resin are envisioned. Useful epoxy resins include those described in "Chemistry and Technology of the Epoxy Resins," B. Ellis (Ed.) Chapman Hall 1993, New York and "Epoxy Resins Chemistry and Technology," C. May and Y. Tanaka, Marcel Dekker, New York (1972). Epoxy resins are curable monomers and oligomers which can be blended with the filler dispersion. The epoxy resins may include an aromatic epoxy resin or an alicyclic epoxy resin having two or more epoxy groups in its molecule. The epoxy resins in the composition of the present disclosure preferably have two or more functionalities, and more preferably two to four functionalities. Useful epoxy resins also include those that could be produced by reaction of a hydroxyl, carboxyl or amine containing compound with epichlorohydrin, preferably in the presence of a basic catalyst, such as a metal hydroxide, for example sodium hydroxide. Also included are epoxy resins produced by reaction of a compound containing at least one and preferably two or more carbon-carbon double bonds with a peroxide, such as a peroxyacid.

The aromatic epoxy resins useful in the epoxy resin matrix preferably have two or more epoxy functionalities, and more preferably two to four epoxy functionalities. Addition of these materials will provide a resin composition with higher glass transition temperatures (Tg). Examples of aromatic epoxy resins useful in the present disclosure include cresol-novolac epoxy resins, bisphenol-A epoxy resins, bisphenol-F epoxy resins, phenol novolac epoxy resins, bisphenol epoxy resins, biphenyl epoxy resins, 4,4'-biphenyl epoxy resins, polyfunctional epoxy resins, divinylbenzene dioxide, and 2-glycidylphenylglycidyl ether. Examples of trifunctional aromatic epoxy resins include triglycidyl isocyanurate epoxy, VG3101L manufactured by Mitsui Chemical and the like, and examples of tetrafunctional aromatic epoxy resins include by Araldite MTO163 manufactured by Ciba Geigy and the like. In one embodiment, preferred epoxy resins for use with the present disclosure include cresol-novolac epoxy resins, and epoxy resins derived from bisphenols.

The multi-functional epoxy monomers are included in the first resin composition of the present disclosure in amounts ranging from about 1% by weight to about 70% by weight of the total composition, with a range of from about 5% by weight to about 35% by weight being preferred. In some cases the amount of epoxy resin is adjusted to correspond to molar amount of other reagents such as novolac resin hardeners.

Cycloaliphatic epoxy resins useful in the compositions of the present disclosure are well known to the art and, as described herein, are compounds that contain at least about one cycloaliphatic group and at least one oxirane group. In one embodiment, epoxides of cycloaliphatic olefins are preferred. More preferred cycloaliphatic epoxies are compounds that contain about one cycloaliphatic group and at least two oxirane rings per molecule. Specific examples include 3-(1,2-epoxyethyl)-7-oxabicyclo heptane; hexanedioic acid, bis(7-oxabicyclo heptylmethyl) ester; 2-(7-oxabicyclohept-3-yl)-spiro(1,3-dioxa-5,3'-(7)-oxabicycloheptane; methyl 3,4-epoxycyclohexane carboxylate, 3-cyclohexenylmethyl-3-cyclohexenylcarboxylate diepoxide, 2-(3,4-epoxy)cyclohexyl-5,5-spiro-(3,4-epoxy)cyclohexane-m-dioxane, 3,4-epoxycyclohexylalkyl-3,4-epoxycyclohexanecarboxylate, 3,4-epoxy-6-methylcyclohexylmethyl-3,4-epoxy-6-methylcyclohexanecarboxylate, vinyl cyclohexanedioxide, bis(3,4-epoxycyclohexylmethyl)adipate, bis(3,4-epoxy-6-methylcyclohexylmethyl)adipate, exo-exo bis(2,3-epoxycyclopentyl) ether, endo-exo bis(2,3-epoxycyclopentyl) ether, 2,2-bis(4-(2,3-epoxypropoxy)cyclohexyl)propane, 2,6-bis(2,3-epoxypropoxycyclohexyl-p-dioxane), 2,6-bis(2,3-epoxypropoxy)norbornene, the diglycidylether of linoleic acid dimer, limonene dioxide, 2,2-bis(3,4-epoxycyclohexyl)propane, dicyclopentadiene dioxide, 1,2-epoxy-6-(2,3-epoxypropoxy)-hexahydro-4,7-methanoindane, p-(2,3-epoxy)cyclopentylphenyl-2,3-epoxypropylether, 1-(2,3-epoxypropoxy)phenyl-5,6- epoxyhexahydro-4,7-methanoindane, o-(2,3-epoxy)cyclopentylphenyl-2,3-epoxypropyl ether), 1,2-bis(5-(1,2-epoxy)-4,7-hexahydromethanoindanoxyl)ethane, cyclopentenylphenyl glycidyl ether, cyclohexanediol diglycidyl ether, butadiene dioxide, dimethylpentane dioxide, diglycidyl ether, 1,4-butanedioldiglycidyl ether, diethylene glycol diglycidyl ether, and dipentene dioxide, and diglycidyl hexahydrophthalate. Typically, the cycloaliphatic epoxy resin is 3-cyclohexenylmethyl-3-cyclohexenylcarboxylate diepoxide.

The cycloaliphatic epoxy monomers are included in the solvent-modified resin composition in amounts ranging from about 0.3% by weight to about 15% by weight of the first resin composition, with a range of from about 0.5% by weight to about 10% by weight being preferred.

Aliphatic epoxy resins useful in the solvent-modified resin compositions include compounds that contain at least one aliphatic group, including $C_4$-$C_{20}$ aliphatic resins or polyglycol type resins. The aliphatic epoxy resin may be either monofunctional, i.e. one epoxy group per molecule, or polyfunctional, i.e. two or more epoxy groups per molecule. Examples of aliphatic epoxy resins include but at not limited to, butadiene dioxide, dimethylpentane dioxide, diglycidyl ether, 1,4-butanedioldiglycidyl ether, diethylene glycol diglycidyl ether, and dipentene dioxide. Such aliphatic epoxy resins are available commercially, such as DER 732 and DER 736 from Dow.

The aliphatic epoxy monomers are included in the solvent-modified resin composition in amounts ranging from about 0.3% by weight to about 15% by weight of the total composition, with a range of from about 0.5% by weight to about 10% by weight being preferred.

Silicone-epoxy resins may be utilized and can be of the formula:

$$M_a M'_b D_c D'_d T_e T'_f Q_g$$

where the subscripts a, b, c, d, e, f and g are zero or a positive integer, subject to the limitation that the sum of the subscripts b, d and f is one or greater; where M has the formula:

$$R^1{}_3SiO_{1/2},$$

M' has the formula:

$$(Z)R^2{}_2SiO_{1/2},$$

D has the formula:

$$R^3{}_2SiO_{2/2},$$

D' has the formula:

$$(Z)R^4SiO_{2/2},$$

T has the formula:

$$R^5SiO_{3/2},$$

T' has the formula:

$$(Z)SiO_{3/2},$$

and Q has the formula $SiO_{4/2}$, where each $R^1$, $R^2$, $R^3$, $R^4$, $R^5$ is independently at each occurrence a hydrogen atom, $C_{1-22}$alkyl, $C_{1-22}$alkoxy, $C_{2-22}$alkenyl, $C_{6-14}$aryl, $C_{6-22}$alkyl-substituted aryl, and $C_{6-22}$arylalkyl which groups may be halogenated, for example, fluorinated to contain fluorocarbons such as $C_{1-22}$ fluoroalkyl, or may contain amino groups to form aminoalkyls, for example aminopropyl or aminoethylaminopropyl, or may contain polyether units of the formula $(CH_2CHR^6O)_k$ where $R^6$ is $CH_3$ or H and k is in a range between about 4 and 20; and Z, independently at each occurrence, represents a radical containing an epoxy group. The term "alkyl" as used in various embodiments of the present disclosure is intended to designate both normal alkyl, branched alkyl, aralkyl, and cycloalkyl radicals. Normal and branched alkyl radicals are preferably those containing in a range between about 1 or about 12 carbon atoms, and include as illustrative non-limiting examples methyl, ethyl, propyl, isopropyl, butyl, tertiary-butyl, pentyl, neopentyl, and hexyl. Cycloalkyl radicals represented are preferably those containing in a range between about 4 and about 12 ring carbon atoms. Some illustrative non-limiting examples of these cycloalkyl radicals include cyclobutyl, cyclopentyl, cyclohexyl, methylcyclohexyl, and cycloheptyl. Preferred aralkyl radicals are those containing in a range between about 7 and about 14 carbon atoms; these include, but are not limited to, benzyl, phenylbutyl, phenylpropyl, and phenylethyl. Aryl radicals used in the various embodiments of the present disclosure are preferably those containing in a range between about 6 and about 14 ring carbon atoms. Some illustrative non-limiting examples of these aryl radicals include phenyl, biphenyl, and naphthyl. An illustrative non-limiting example of a halogenated moiety suitable is 3,3,3-trifluoropropyl. Combinations of epoxy monomers and oligomers are also contemplated for use with the present disclosure.

Suitable solvents for use with the resin include, for example, 1-methoxy-2-propanol, methoxy propanol acetate, butyl acetate, methoxyethyl ether, methanol, ethanol, isopropanol, ethyleneglycol, ethylcellosolve, methylethyl ketone, cyclohexanone, benzene, toluene, xylene, and cellosolves such as ethyl acetate, cellosolve acetate, butyl cellosolve acetate, carbitol acetate, and butyl carbitol acetate. These solvents may be used either singly or in the form of a combination of two or more members. In one embodiment, a preferred solvent for use with this disclosure is 1-methoxy-2-propanol. The solvent is present in the solvent-modified resin composition in an amount of from about 5 weight percent to about 70 weight percent, preferably about 15 weight percent to about 40 weight percent, and ranges there between. Due to the addition of solvent, the first curable transparent resin is sometimes referred to herein as a "solvent-modified resin," and these terms can be used interchangeably.

The filler utilized to make the modified fillers in the first resin composition of the present disclosure is preferably a colloidal silica which is a dispersion of submicron-sized silica ($SiO_2$) particles in an aqueous or other solvent medium. The dispersion contains at least about 10 weight percent and up to about 85 weight percent of silicon dioxide ($SiO_2$), and typically between about 30 weight percent to about 60 weight percent of silicon dioxide. The particle size of the colloidal silica in the first resin composition is typically in a range between about 1 nanometers (nm) and about 250 nm, and more typically in a range between about 5 nm and about 100 nm, with a range from about 5 nm to about 50 nm being preferred in one embodiment.

In yet another embodiment, the preferred range is from about 50 nm to about 100 nm with a range of from about 50 nm to about 75 nm being more preferred. The colloidal silica is functionalized with an organoalkoxysilane to form a functionalized colloidal silica, as described below.

Organoalkoxysilanes used to functionalize the colloidal silica are included within the formula:

$$(R^7)_a Si(OR^8)_{4-a},$$

where $R^7$ is independently at each occurrence a $C_{1-18}$ monovalent hydrocarbon radical optionally further functionalized with alkyl acrylate, alkyl methacrylate or epoxide groups or $C_{6-14}$ aryl or alkyl radical, $R^8$ is independently at each occurrence a $C_{1-18}$ monovalent hydrocarbon radical or a hydrogen radical and "a" is a whole number equal to 1 to 3 inclusive. Preferably, the organoalkoxysilanes included in the present disclosure are phenyl trimethoxysilane, 2-(3,4-epoxy cyclohexyl)ethyltrimethoxysilane, 3-glycidoxypropyltrimethoxysilane, and methacryloxypropyltrimethoxysilane. In a preferred embodiment, phenyl trimethoxysilane can be used to functionalize the colloidal silica. In yet another embodiment, phenyl trimethoxysilane is used to functionalize the colloidal silica. A combination of fuctionalities is also possible.

Typically, the organoalkoxysilane is present in a range between about 0.5 weight % and about 60 weight % based on the weight of silicon dioxide contained in the colloidal silica in the first resin composition, preferably from about 5 weight % to about 30 weight %.

The functionalization of colloidal silica may be performed by adding the functionalization agent to a commercially available aqueous dispersion of colloidal silica in the weight ratio described above to which an aliphatic alcohol has been added. The resulting composition comprising the functionalized colloidal silica and the functionalization agent in the aliphatic alcohol is defined herein as a pre-dispersion. The aliphatic alcohol may be selected from, but not limited to, isopropanol, t-butanol, 2-butanol, and combinations thereof. The amount of aliphatic alcohol is typically in a range between about 1 fold and about 10 fold of the amount of silicon dioxide present in the aqueous colloidal silica pre-dispersion.

The resulting organofunctionalized colloidal silica can be treated with an acid or base to neutralize the pH. An acid or base as well as other catalyst promoting condensation of silanol and alkoxysilane groups may also be used to aid the functionalization process. Such catalysts include organo-titanate and organo-tin compounds such as tetrabutyl titanate, titanium isopropoxybis(acetylacetonate), dibutyltin dilaurate, or combinations thereof. In some cases, stabilizers such as 4-hydroxy-2,2,6,6-tetramethylpiperidinyloxy (i.e. 4-hydroxy TEMPO) may be added to this pre-dispersion. The resulting pre-dispersion is typically heated in a range between about 50° C. and about 100° C. for a period in a range between about 1 hour and about 12 hours.

The cooled transparent pre-dispersion is then further treated to form a final dispersion. Optionally curable monomers or oligomers may be added and optionally, more aliphatic solvent which may be selected from but not limited to isopropanol, 1-methoxy-2-propanol, 1-methoxy-2-propyl acetate, toluene, and combinations thereof. This final dispersion of the functionalized colloidal silica may be treated with acid or base or with ion exchange resins to remove acidic or basic impurities.

The final dispersion composition can be hand-mixed or mixed by standard mixing equipment such as dough mixers, chain can mixers, and planetary mixers. The blending of the dispersion components can be performed in batch, continuous, or semi-continuous mode by any means used by those skilled in the art.

This final dispersion of the functionalized colloidal silica is then concentrated under a vacuum in a range between about 0.5 Torr and about 250 Torr and at a temperature in a range between about 20° C. and about 140° C. to substantially remove any low boiling components such as solvent, residual water, and combinations thereof to give a transparent dispersion of functionalized colloidal silica which may optionally contain curable monomer, here referred to as a final concentrated dispersion. Substantial removal of low boiling components is defined herein as removal of low boiling components to give a concentrated silica dispersion containing from about 15% to about 80% silica.

B-staging of the first resin composition typically occurs at a temperature in a range between about 50° C. and about 250° C., more typically in a range between about 70° C. and about 100° C., in a vacuum at a pressure ranging between about 25 mmHg and about 250 mmHg, and more preferably between about 100 mmHg and about 200 mmHg. In addition, B-staging may typically occur over a period of time ranging from about 30 minutes to about 5 hours, and more typically in a range between about 45 minutes and about 2.5 hours. Optionally, the B-staged resins can be post-cured at a temperature in a range between about 100° C. and about 250° C., more typically in range between about 150° C. and about 200° C. over a period of time ranging from about 45 minutes to about 3 hours.

The resulting first resin composition preferably contains functionalized silicon dioxide as the functionalized colloidal silica. In such a case, the amount of silicon dioxide in the final composition can range from about 15% to about 80% by weight of the final composition, more preferably from about 25% to about 75% by weight, and most preferably from about 30% to about 70% by weight of the final cured resin composition. The colloidal silica filler is essentially uniformly distributed throughout the disclosed composition, and this distribution remains stable at room temperature. As used herein "uniformly distributed" means the absence of any visible precipitate with such dispersions being transparent.

In some instances, the pre-dispersion or the final dispersion of the functionalized colloidal silica may be further functionalized. Low boiling components are at least partially removed and subsequently, an appropriate capping agent that will react with residual hydroxyl functionality of the functionalized colloidal silica is added in an amount in a range between about 0.05 times and about 10 times the amount of silicon dioxide present in the pre-dispersion or final dispersion. Partial removal of low boiling components as used herein refers to removal of at least about 10% of the total amount of low boiling components, and preferably, at least about 50% of the total amount of low boiling components.

An effective amount of capping agent caps the functionalized colloidal silica and capped functionalized colloidal silica is defined herein as a functionalized colloidal silica in which at least 10%, preferably at least 20%, more preferably at least 35%, of the free hydroxyl groups present in the corresponding uncapped functionalized colloidal silica have been functionalized by reaction with a capping agent.

In some cases capping the functionalized colloidal silica effectively improves the cure of the total curable resin formulation by improving room temperature stability of the resin formulation. Formulations which include the capped functionalized colloidal silica show much better room temperature stability than analogous formulations in which the colloidal silica has not been capped in some cases.

Exemplary capping agents include hydroxyl reactive materials such as silylating agents. Examples of a silylating agent include, but are not limited to hexamethyldisilazane (HMDZ), tetramethyldisilazane, divinyltetramethyldisilazane, diphenyltetramethyldisilazane, N-(trimethylsilyl)diethylamine, 1-(trimethylsilyl)imidazole, trimethylchlorosilane, pentamethylchlorodisiloxane, pentamethyldisiloxane, and combinations thereof. In a preferred embodiment, hexamethyldisilazane is used as the capping agent. Where the dispersion has been further functionalized, e.g. by capping, at least one curable monomer is added to form the final dispersion. The dispersion is then heated in a range between about 20° C. and about 140° C. for a period of time in a range between about 0.5 hours and about 48 hours. The resultant mixture is then filtered. The mixture of the functionalized colloidal silica in the curable monomer is concentrated at a pressure in a range between about 0.5 Torr and about 250 Torr to form the final concentrated dispersion. During this process, lower boiling components such as solvent, residual water, byproducts of the capping agent and hydroxyl groups, excess capping agent, and combinations thereof are substantially removed to give a dispersion of capped functionalized colloidal silica containing from about 15% to about 75% silica.

Optionally, an epoxy hardener such as an amine epoxy hardener, a phenolic resin, a hydroxy aromatic compound, a carboxylic acid-anhydride, or a novolac hardener may be added. In some embodiments, a difunctional siloxane anhydride may be used as an epoxy hardener, optionally in combination with at least one of the foregoing hardeners. Additionally, cure catalysts or organic compounds containing hydroxyl moiety are optionally added with the epoxy hardener.

Exemplary amine epoxy hardeners typically include aromatic amines, aliphatic amines, or combinations thereof. Aromatic amines include, for example, m-phenylene diamine, 4,4'-methylenedianiline, diaminodiphenylsulfone, diaminodiphenyl ether, toluene diamine, dianisidene, and blends of amines. Aliphatic amines include, for example, ethyleneamines, cyclohexyldiamines, alkyl substituted diamines, menthane diamine, isophorone diamine, and hydrogenated versions of the aromatic diamines. Combinations of amine epoxy hardeners may also be used. Illustrative examples of amine epoxy hardeners are also described in "Chemistry and Technology of the Epoxy Resins" B. Ellis (Ed.) Chapman Hall, New York, 1993.

Exemplary phenolic resins typically include phenol-formaldehyde condensation products, commonly named novolac or cresol resins. These resins may be condensation products of different phenols with various molar ratios of formaldehyde. Such novolac resin hardeners include those commercially available such as TAMANOL 758 or HRJ1583 oligomeric resins available from Arakawa Chemical Industries and Schenectady International, respectively. Additional examples of phenolic resin hardeners are also described in "Chemistry and Technology of the Epoxy Resins" B. Ellis (Ed.) Chapman Hall, New York, 1993. While these materials are representative of additives used to promote curing of the epoxy formulations, it will apparent to those skilled in the art that other materials such as but not limited to amino formaldehyde resins may be used as hardeners and thus fall within the scope of this disclosure.

Suitable hydroxy aromatic compounds are those that do not interfere with the resin matrix of the present composition. Such hydroxy-containing monomers may include hydroxy aromatic compounds represented by the following formula:

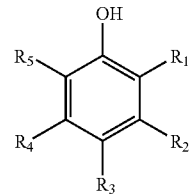

wherein R1 to R5, is independently a $C_1$–$C_{10}$ branched or chain aliphatic or aromatic group, or hydroxyl. Examples of such hydroxyl aromatic compounds include, but are not limited to, hydroquinone, resorcinol, catechol, methylhydroquinone, methyl resorcinol and methyl catechol. If present, the hydroxy aromatic compounds are present in an amount of from about 0.3 weight percent to about 15 weight percent, and preferably, about 0.5 to about 10 weight percent.

Exemplary anhydride curing agents typically include methylhexahydrophthalic anhydride (MHHPA), methyltetrahydrophthalic anhydride, 1,2-cyclohexanedicarboxylic anhydride, bicyclo[2.2.1]hept-5-ene-2,3-dicarboxylic anhydride, methylbicyclo[2.2.1]hept-5-ene-2,3-dicarboxylic anhydride, phthalic anhydride, pyromellitic dianhydride, hexahydrophthalic anhydride, dodecenylsuccinic anhydride, dichloromaleic anhydride, chlorendic anhydride, tetrachlorophthalic anhydride, and the like. Combinations comprising at least two anhydride curing agents may also be used. Illustrative examples are described in "Chemistry and Technology of the Epoxy Resins"; B. Ellis (Ed.) Chapman Hall, New York, (1993) and in "Epoxy Resins Chemistry and Technology"; edited by C. A. May, Marcel Dekker, New York, 2nd edition, (1988).

Exemplary difunctional siloxane anhydrides and methods for their production are known to those skilled in the art and include, for example, the anhydrides disclosed in U.S. Pat. Nos. 4,542,226 and 4,381,396. Suitable anhydrides include those of the following formula:

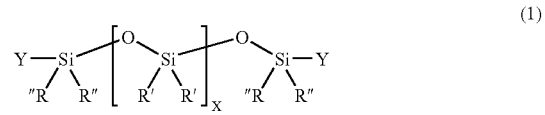

(1)

where X can be from 0 to 50 inclusive, preferably X can be from 0 to 10 inclusive, and most preferably X can be from 1 to 6 inclusive; where each R' and R" are independently at each occurrence $C_{1-22}$ alkyl, $C_{1-22}$ alkoxy, $C_{2-22}$ alkenyl, $C_{6-14}$ aryl, $C_{6-22}$ alkyl-substituted aryl, and $C_{6-22}$ arylalkyl; and where Y is represented by the following formula:

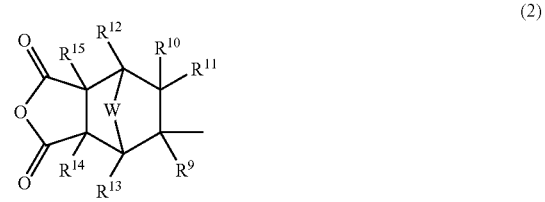

(2)

where $R^9$–$R^{15}$ are a members selected from hydrogen, halogen, $C_{(1-13)}$ monovalent hydrocarbon radicals and substituted $C_{(1-13)}$ monovalent hydrocarbon radicals, and W is selected from —O— and $CR_2$—, wherein R has the same definition as $R^9$–$R^{15}$.

In some embodiments the R' and R" may be halogenated, for example fluorinated, to provide fluorocarbons such as $C_{1-22}$ fluoroalkyl. Preferably, R' and R" are methyl, ethyl, 3,3,3-trifluoropropyl or phenyl, most preferably R' and R" are both methyl. The difunctional siloxane anhydride utilized in the present disclosure as an epoxy hardener can be a single compound or a mixture of oligomers with different lengths of siloxane chain which are terminated with the Y moiety.

Preferably, the difunctional siloxane anhydrides of the present disclosure are of the following formula:

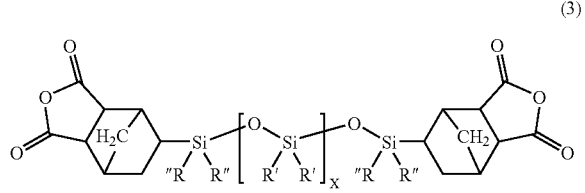

(3)

where X, R' and R" are as defined above in formula (1), i.e., X can be from 0 to 50 inclusive, preferably X can be from 0 to 10 inclusive, and most preferably X can be from 1 to 6 inclusive; and each R' and R" is independently at each occurrence C1–22 alkyl, C1–22 alkoxy, C2–22 alkenyl, C6–14 aryl, C6–22 alkyl-substituted aryl, and C6–22 arylalkyl. In some embodiments the R' and R" may be halogenated, for example fluorinated, to provide fluorocarbons such as $C_{1-22}$ fluoroalkyl. Preferably, R' and R" are methyl, ethyl, 3,3,3-trifluoropropyl, or phenyl, most preferably methyl. As described above, a single compound can be used or a mixture of oligomers with different lengths of siloxane chain may be used.

In one embodiment, the oligosiloxane dianhydride of the present disclosure is synthesized by hydrosilation of 1 mol 1,1,3,3,5,5-hexamethyltrisiloxane with two moles of 5-norbornene-2,3-dicarboxylic anhydride in the presence of Karstedt's platinum catalyst (the complex of $Pt^0$ with divinyltetramethyldisiloxane described in U.S. Pat. No. 3,775, 442). In one embodiment, 5,5'-(1,1,3,3,5,5-hexamethyl-1,5, trisiloxanediyl)bis[hexahydro-4,7-methanoisobenzofuran-1, 3-dione] can be used as the difunctional siloxane anhydride.

Cure catalysts which can be added to form the epoxy formulation can be selected from typical epoxy curing catalysts that include but are not limited to, amines, alkyl-substituted imidazole, imidazolium salts, phosphines, metal salts such as aluminum acetyl acetonate (Al(acac)3), salts of nitrogen-containing compounds with acidic compounds, and combinations thereof. The nitrogen-containing compounds include, for example, amine compounds, di-aza compounds, tri-aza compounds, polyamine compounds and combinations thereof. The acidic compounds include phenol, organo-substituted phenols, carboxylic acids, sulfonic acids and combinations thereof. A preferred catalyst is a salt of nitrogen-containing compounds. Salts of nitrogen-containing compounds include, for example 1,8-diazabicyclo(5,4,0)-7-undecane. The salts of the nitrogen-containing compounds are available commercially, for example, as Polycat SA-1 and Polycat SA-102 available from Air Products. Preferred catalysts include triphenyl phosphine (TPP), N-methylimidazole (NMI), and dibutyl tin dilaurate (DiBSn).

Examples of organic compounds utilized as the hydroxyl-containing moiety include alcohols such as diols, high boiling alkyl alcohols containing one or more hydroxyl groups and bisphenols. The alkyl alcohols may be straight chain, branched or cycloaliphatic and may contain from 2 to 12 carbon atoms. Examples of such alcohols include but are not limited to ethylene glycol; propylene glycol, i.e., 1,2- and 1,3-propylene glycol; 2,2-dimethyl-1,3-propane diol; 2-ethyl, 2-methyl, 1,3-propane diol; 1,3- and 1,5-pentane diol; dipropylene glycol; 2-methyl-1,5-pentane diol; 1,6-hexane diol; dimethanol decalin, dimethanol bicyclo octane; 1,4-cyclohexane dimethanol and particularly its cis- and trans-isomers; triethylene glycol; 1,10-decane diol; and combinations of any of the foregoing. Further examples of alcohols include 3-ethyl-3-hydroxymethyl-oxetane (commercially available as UVR6000 from Dow Chemicals and bisphenols.

Some illustrative, non-limiting examples of bisphenols include the dihydroxy-substituted aromatic hydrocarbons disclosed by genus or species in U.S. Pat. No. 4,217,438. Some preferred examples of dihydroxy-substituted aromatic compounds include 4,4'-(3,3,5-trimethylcyclohexylidene)-diphenol; 2,2-bis(4-hydroxyphenyl)propane (commonly known as bisphenol A); 2,2-bis(4-hydroxyphenyl)methane (commonly known as bisphenol F); 2,2-bis(4-hydroxy-3,5-dimethylphenyl)propane; 2,4'-dihydroxydiphenylmethane; bis(2-hydroxyphenyl)methane; bis(4-hydroxyphenyl)methane; bis(4-hydroxy-5-nitrophenyl)methane; bis(4-hydroxy-2,6-dimethyl-3-methoxyphenyl)methane; 1,1-bis(4-hydroxyphenyl)ethane; 1,1-bis(4-hydroxy-2-chlorophenyl ethane; 2,2-bis(3-phenyl-4-hydroxyphenyl)propane; bis(4-hydroxyphenyl)cyclohexylmethane; 2,2-bis(4-hydroxyphenyl)-1-phenylpropane; 2,2,2',2'-tetrahydro-3,3,3',3'-tetramethyl, 1'-spirobi[1H-indene]-6,6'-diol (SBI); 2,2-bis(4-hydroxy-3-methylphenyl)propane (commonly known as DMBPC); and $C_{1-13}$ alkyl-substituted resorcinols. Most typically, 2,2-bis(4-hydroxyphenyl)propane and 2,2-bis(4-hydroxyphenyl) methane are the preferred bisphenol compounds. Combinations of organic compounds containing hydroxyl moiety can also be used in the present disclosure.

A reactive organic diluent may also be added to the total curable epoxy formulation to decrease the viscosity of the composition. Examples of reactive diluents include, but are not limited to, 3-ethyl-3-hydroxymethyl-oxetane, dodecylglycidyl ether, 4-vinyl-1-cyclohexane diepoxide, di(Beta-(3, 4-epoxycyclohexyl)ethyl)-tetramethyldisiloxane, and combinations thereof. Reactive organic diluents may also include monofunctional epoxies and/or compounds containing at least one epoxy functionality. Representative examples of such diluents include, but are not limited to, alkyl derivatives of phenol glycidyl ethers such as 3-(2-nonylphenyloxy)-1,2-epoxypropane or 3-(4-nonylphenyloxy)-1,2-epoxypropane. Other diluents which may be used include glycidyl ethers of phenol itself and substituted phenols such as 2-methylphenol, 4-methyl phenol, 3-methylphenol, 2-butylphenol, 4-butylphenol, 3-octylphenol, 4-octylphenol, 4-t-butylphenol, 4-phenylphenol and 4-(phenylisopropylidene)phenol.

Adhesion promoters can also be employed with the first curable resin such as trialkoxyorganosilanes (e.g., γ-aminopropyltrimethoxysilane, 3-glycidoxypropyltrimethoxysilane, and bis(trimethoxysilylpropyl)fumarate). Where present, the adhesion promoters are added in an effective amount which is typically in a range between about 0.01% by weight and about 2% by weight of the total final dispersion.

Optionally, micron size fused silica filler may be added to the resins. Where present, the fused silica fillers are added in an effective amount to provide further reduction in CTE.

Flame retardants can be optionally used in the first curable resin in a range between about 0.5 weight % and about 20 weight % relative to the amount of the total final dispersion. Examples of flame retardants include phosphoramides, triphenyl phosphate (TPP), resorcinol diphosphate (RDP), bisphenol-a-disphosphate (BPA-DP), organic phosphine oxides, halogenated epoxy resin (tetrabromobisphenol A), metal oxide, metal hydroxides, and combinations thereof.

In addition to the epoxy resin matrix described, two or more epoxy resins may be used in combination for the aromatic epoxy resin of the first curable resin e.g., a mixture of an alicyclic epoxy and an aromatic epoxy. Such a combination improves transparency and flow properties. It is preferable to use an epoxy mixture containing at least one epoxy resin having three or more functionalities, to thereby form an underfill resin having low CTE, good fluxing performance, and a high glass transition temperature. The epoxy resin can include a trifunctional epoxy resin, in addition to at least a difunctional alicyclic epoxy and a difunctional aromatic epoxy.

The second curable fluxing resin composition of the present disclosure includes a resin matrix of at least one epoxy resin. The epoxy resin of the second fluxing composition can be any epoxy resin described above as suitable for use in the first solvent-modified resin, or combinations thereof. The second curable fluxing resin can include any epoxy hardener described above, as well as any catalyst, hydroxyl-containing moiety, reactive organic diluent, adhesion promoter, flame retardant, or combinations thereof as described above as suitable for use with the solvent-modified resin.

In some embodiments, where utilized, aliphatic epoxy monomers can be included in the resin component of the second fluxing resin composition in amounts ranging from about 1% to about 50% by weight of the resin component of the second fluxing composition, with a range of from about 5% to about 25% by weight being preferred.

In some embodiments, where utilized, cycloaliphatic epoxy monomers can be included in the resin component of the second fluxing resin composition in amounts ranging from about 1% to about 100% by weight of the resin component of the second fluxing composition, with a range of from about 25% to about 75% by weight being preferred.

In some embodiments, where utilized, aromatic epoxy monomers can be included in the resin component of the second fluxing resin composition in amounts ranging from about 1% to about 100% by weight of the resin component of the second fluxing composition, with a range of from about 25% to about 75% by weight being preferred.

In one embodiment the epoxy resin can be a combination of 3-cyclohexenylmethyl-3-cyclohexenylcarboxylate diepoxide (commercially available as UVR 6105 from Dow Chemical Co.), and bisphenol-F epoxy resin (commercially available as RSL-1739 from Resolution Performance Product). In another embodiment, a suitable epoxy resin includes a combination of 3-cyclohexenylmethyl-3-cyclohexenylcarboxylate diepoxide and bisphenol-A epoxy resin (commercially available as RSL-1462 from Resolution Performance Product). Combinations of the foregoing may also be used.

In one embodiment, the second curable fluxing resin includes a difunctional siloxane anhydride as described above which, in some cases, can be combined with another epoxy hardener such as an amine epoxy hardener, a phenolic resin, a carboxylic acid-anhydride, or a novolac hardener as described above. In some embodiments, the difunctional siloxane anhydride of the present disclosure is miscible with liquid carboxylic acid-anhydrides. The difunctional siloxane anhydride may thus be blended with a carboxylic acid-anhydride to form a liquid solution. In these embodiments, the epoxy hardener preferably includes a difunctional siloxane anhydride in combination with a liquid organic anhydride such as hexahydrophthalic anhydride, MHHPA, or tetrahydrophthalic anhydride, most preferably MHHPA.

Where utilized, the difunctional siloxane anhydrides can be included in the hardener component of the second curable fluxing resin composition in amounts ranging from about 1% to about 100% by weight of the hardener component of the second curable fluxing resin composition, preferably in a range of from about 10% to about 90% by weight, most preferably from about 10% to about 40% by weight.

Where utilized, the carboxylic acid-anhydrides are included in the hardener component of the second curable fluxing resin composition in amounts ranging from about 1% to about 95% by weight of the hardener component of the composition, with a range of from about 10% to about 90% by weight being preferred and 60% to about 90% by weight being the most preferred.

Examples of the second fluxing resin include combinations of 3-cyclohexenylmethyl-3-cyclohexenylcarboxylate diepoxide (commercially available as UVR 6105 from Dow Chemical Co.), bisphenol-F epoxy resin (including RSL-1739 which is commercially available from Resolution Performance Product), MHHPA, catalysts including salts of nitrogen-containing compounds such as Polycat SA-1 (from Air Products), and organic compounds having a hydroxyl-containing moiety such as 3-ethyl-3-hydroxy methyl oxetane, (commercially available as UVR 6000 from Dow Chemical Co.). In some embodiments, a bisphenol-A epoxy resin (such as RSL-1462 from Resolution Performance Product) may be used in place of the bisphenol-F resin. In other embodiments, it is preferably to include an additional difunctional siloxane anhydride epoxy hardener such as 5,5'-(1,1,3,3,5,5-hexamethyl-1,5,trisiloxanediyl)bis [hexahydro-4,7-methanoisobenzofuran-1,3-dione] (TriSDA). Where a bisphenol epoxy resin is utilized, the bisphenol resin preferably is present in the epoxy component of the second fluxing resin in an amount ranging from about 1% by weight to 100% by weight of the resin composition, with a range of from about 25% by weight to about 75% by weight being preferred.

The second curable fluxing resin composition preferably is a liquid having a viscosity ranging from about 50 centipoise to about 100,000 centipoise, more preferably in a range between about 1000 centipoise and about 20,000 centipoise at 25° C. before the composition is cured. The second fluxing resin can optionally be combined with a particle filler dispersion which, in one embodiment, comprises at least one colloidal silica functionalized with an organoalkoxysilane as described above having a particle size in a range between about 1 nm and about 500 nm, and more typically in a range between about 5 nm and about 200 nm.

Methods for producing the compositions of the present disclosure result in improved underfill materials. For the first solvent-modified resin composition, in one embodiment compositions are prepared by functionalizing colloidal silica such that a stable concentrated dispersion of colloidal silica is formed; forming a concentrated dispersion of functionalized colloidal silica containing about 15% to about 75% silica; blending solutions of epoxy monomers including at least aromatic epoxy resin optionally in combination with cycloaliphatic epoxy monomers, aliphatic epoxy monomers, and/or hydroxy aromatic compounds, and optionally one or more additives such as hardeners, catalysts or other additives described above, and at least one solvent with the functionalized colloidal silica dispersion; and removing the solvent to form a hard, transparent B-stage resin film.

The second curable fluxing resin composition may be similarly prepared. In one embodiment, second curable fluxing resin compositions are prepared by blending solutions of epoxy monomers and optionally one or more additives such as hardeners, catalysts or other additives described above. In some cases, the second fluxing resin includes a functionalized colloidal silica dispersion as a filler and is prepared in the same manner as the functionalized colloidal silica dispersion utilized in the first solvent-modified resin. In other embodiments, the second fluxing resin does not include a functionalized colloidal silica dispersion as a filler.

Curing the B-stage resin film in combination with the second fluxing resin is useful in forming a low CTE, high Tg thermoset resin for use as an underfill material.

While underfilling may be achieved by any method known in the art, preferably the first resin composition of the present disclosure is applied as wafer level underfill. The wafer level underfilling process includes dispensing underfill materials onto the wafer, followed by removal of solvent to form a solid, transparent B-stage resin before dicing into individual chips that are subsequently mounted in the final structure via flip-chip type operations.

The second curable fluxing resin is then applied to a substrate as a no-flow underfill. The process generally includes first dispensing the second resin material onto a substrate or semiconductor device, placing a flip chip coated with the solvent-modified resin of the present disclosure on top of the fluxing resin, and then performing a solder bump reflow operation to simultaneously form solder joints and cure the two resin compositions which make up the underfill material. The combined resins thus act as an encapsulant material between chip and substrate.

Preferably, the two resin compositions of the present disclosure are utilized as follows. The first solvent-modified resin is applied to a wafer or chip and cured as described above to form a B-stage resin. If the first solvent-modified resin has been applied as wafer level underfill, it is subjected to dicing or a similar operation after formation of the B-stage resin to produce individual chips.

Once the chips have been prepared, the second fluxing resin is applied to a substrate. Methods for applying the second fluxing resin are known to those skilled in the art and include dispensing with a needle and printing. Preferably, the second fluxing resin of the present disclosure is dispensed using a needle in a dot pattern in the center of a component footprint area. The amount of second fluxing resin is carefully controlled to avoid the phenomenon known as "chip-floating", which results from dispensing an excess of the fluxing resin. The flip-chip die coated with the solvent-modified resin that has been B-staged is placed on top of the dispensed second fluxing resin using an automatic pick and place machine. The placement force as well as the placement head dwell time are controlled to optimize cycle time and yield of the process.

The entire construction is then heated to melt solder balls, form solder interconnects and cure the B-stage resin in combination with the fluxing resin. The heating operation usually is performed on the conveyor in the reflow oven. The underfill can be cured by two significantly different reflow profiles. The first profile is referred to as the "plateau" profile, which includes a soak zone below the melting point of the solder. The second profile, referred to as the "volcano" profile, raises the temperature at a constant heating rate until the maximum temperature is reached. The maximum temperature during a cure cycle can range from about 200° C. to about 260° C. The maximum temperature during the reflow strongly depends on the solder composition and has to be about 10° C. to about 40° C. higher than the melting point of the solder balls. The heating cycle is between about 3 to about 10 minutes, and more typically is from about 4 to about 6 minutes. The underfill may cure completely after the solder joints are formed or may require additional post-cure. Optionally, post-curing can occur at a temperature ranging from about 100° C. to about 180° C., more typically from about 140° C. to about 160° C. over a period of time ranging from about 1 hour to about 4 hours.

Thus, the use of a first solvent-modified epoxy resin is useful in producing B-stage resin films, and once combined with a second fluxing resin, curing the combination of the two resins is useful to produce low CTE, high Tg thermoset resins. The transparency of the B-stage resin films formed from the first solvent-modified resin of the present disclosure makes them especially suitable as wafer level underfill materials as they do not obscure guide marks used for wafer dicing.

The second fluxing resin advantageously holds the chip to which the first solvent-modified resin has been applied in place during reflow operations. Moreover, by following the methods of the present disclosure, where the second fluxing resin is unfilled, one can obtain a graded underfill material with the CTE of the material decreasing from the substrate to the chip.

It has been surprisingly found that by following the methods of the present disclosure, one can obtain underfill materials having elevated levels of functionalized colloidal silica that are not otherwise obtainable by current methods. In addition, the B-stage resin films in combination with the second fluxing resin provide good electrical connections during solder reflow operations resulting in low CTE, high Tg thermoset resins after curing.

Underfill materials as described in the present disclosure are dispensable and have utility in devices such as but not limited to solid state devices and/or electronic devices such as computers or semiconductors, or any device where underfill, overmold, or combinations thereof are needed. The underfill material can be used to reinforce physical, mechanical, and electrical properties of solder bumps that typically connect a chip and a substrate. The disclosed underfill material exhibits enhanced performance and advantageously has lower manufacturing costs especially as the use of the second resin minimizes chip misalignment during reflow. The underfill materials of the present disclosure permit the formation of solder joints before the underfill materials reach a gel point, yet the underfill materials are capable of forming a solid encapsulant at the end of the heat cycle. The composition of the present disclosure has the ability to fill gaps ranging from about 30 to about 500 microns.

In order that those skilled in the art will be better able to practice the present disclosure, the following examples are given by way of illustration and not by way of limitation.

EXAMPLE 1

Preparation of functionalized colloidal silica (FCS) predispersion. A functionalized colloidal silica predispersion was prepared by combining the following: 935 g of isopropanol (Aldrich) was slowly added by stirring to 675 grams of aqueous colloidal silica (Nalco 1034A, Nalco Chemical Company) containing 34 weight % of 20 nm particles of $SiO_2$. Subsequently, 58.5 g phenyl trimethoxysilane (PTS) (Aldrich), which was dissolved in 100 g isopropanol, was added to the stirred mixture. The mixture was then heated to 80° C. for 1–2 hours to afford a clear suspension. The resulting suspension of functionalized colloidal silica was stored at room temperature. Multiple dispersions, having various levels of SiO$_2$ (from 10% to 30%) were prepared for use in Example 2.

EXAMPLE 2

Preparation of dispersion of a functionalized colloidal silica in epoxy resin. A round bottom 2000 ml flask was charged with 540 g of each of the pre-dispersions, prepared in Example 1. Additional pre-dispersion compositions are shown in Table 1, below. 1-methoxy-2-propanol (750 g) was then added to each flask. The resulting dispersion of functionalized colloidal silica was vacuum stripped at 60° C. and 60 mmHg to remove about 1 L of solvents. The vacuum was slowly decreased and solvent removal continued with good agitation until the dispersion weight had reached 140 g. The clear dispersion of phenyl-functionalized colloidal silica contained 50% SiO$_2$ and no precipitated silica. This dispersion was stable at room temperature for more than three months. The results in Table 1 show that a certain level of phenyl functionality is required in order to prepare a concentrated, stable FCS dispersion in 1-methoxy-2-propanol (Dispersion 1 through 5). The functionality level can be adjusted to achieve a clear, stable dispersion in methoxypropanol acetate. This adjustment indicated that optimization of functionality level permitted dispersions to be prepared in other solvents (Dispersions 6 and 7).

TABLE 1

Preparation of FCS Dispersions

| Entry# | Pre-dispersion Composition (PTS*/100 g SiO2) | Final Dispersion Concentration (wt % SiO2)/ wt % total solids) | Dispersion Stability (in methoxypropanol) |
|---|---|---|---|
| 1 | 0.028 m/100 g | 50% SiO2/63% | Precipitated |
| 2 | 0.056 m/100 g | 47% SiO2/60% | Precipitated |
| 3 | 0.13 m/100 g | 53% SiO2/66% | stable, clear |
| 4 | 0.13 m/100 g | 60% SiO2/75% | stable, clear |
| 5 | 0.19 m/100 g | 50% SiO2/63% | stable, clear (in methoxy propanol acetate) |
| 6 | 0.13 m/100 g | 50% SiO2/63% | Precipitated |
| 7 | 0.19 m/100 g | 50% SiO2/63% | stable, clear |

*PTS is phenyltrimethoxysilane

EXAMPLE 3

Preparation of a dispersion of capped functionalized colloidal silica in epoxy resin. A solution combining 5.33 g of epoxy cresol novolac (ECN 195XL-25 available from Sumitomo Chemical Co.), 2.6 g of novolac hardener (Tamanol 758 available from Arakawa Chemical Industries) in 3.0 g of 1-methoxy-2-propanol was heated to about 50° C. A 7.28 g portion of the solution was added, dropwise, to 10.0 g of the FCS dispersion, by stirring at 50° C. (see, Table 1, entry #3, 50% SiO$_2$ in methoxypropanol, above). The clear suspension was cooled and a catalyst solution of N-methylimidazole, 60 microliters of a 50% w/w solution in methoxypropanol was added by stirring. The clear solution was used directly to cast resin films for characterization or stored at −10° C. Additional films were prepared using differing catalysts in various amounts and some variations in the epoxy as set forth in Table 2 below which shows final resin compositions.

Films were cast by spreading a portion of the epoxy-silica dispersion on glass plates, and the solvent was removed in an oven set at 85° C. under a vacuum of 150 mmHg. After 1–2 hours, the glass plates were removed and the film remaining was clear and hard. In some cases, the dry film was cured at 220° C. for 5 minutes followed by heating at 160° C. for 60 minutes. Glass transition temperature measurements were obtained by Differential Scanning Calorimetry using a commercially available DSC from Perkin Elmer. The formulations tested and their Tg are set forth below in Table 2.

TABLE 2

Colloidal Silica Formulations

| Entry # | Epoxy (g)* | Hardener** (g) | Solvent*** (g) | Catalyst**** (g) | FCS amount***** | Tg****** |
|---|---|---|---|---|---|---|
| 1 | ECN (3.55) | T758 (1.73) | MeOPrOH(2) | TPP (0.12) | 10 | 168 |
| 2 | ECN (3.55) | T758 (1.73) | MeOPrOH(2) | TPP (0.06) | 10 | 165 |
| 3 | ECN (3.55) | T758 (1.73) | MeOPrOH(2) | NMI (0.015) | 10 | 199 |
| 4 | ECN (3.55) | T758 (1.73) | MeOPrOH(2) | NMI (0.018) | 5 | 180 |
| 5 | ECN (3.55) Epon 1002F (0.5) | T758 (1.73) | MeOPrOH(2) | TPP (0.06) | 10 | 136 |
| 6 | ECN (3.55) Epon 1002F (0.5) | T758 (1.73) | MeOPrOH(2) | NMI (0.03) | 10 | 184 |
| 7 | ECN (3.55) | T758 (1.73) | BuAc(2) | TPP (0.12) | 5 | 171 |
| 8 | ECN (3.55) | T758 (1.73) | diglyme(2) | TPP (0.12) | 5 | 171 |
| 9 | ECN (3.55) | T758 (1.73) | BuAc(2) | DiBSn (0.12) | 5 | 104 |

*ECN refers to ECN 195XL-25 available form Sumitomo Chemical Co. and Epon 1002F refers to an oligomerized BPA diglycidyl ether epoxy available from Resolution Performance Products.
**T758 refers to Tamanol 758 available from Arakawa Chemical Industries
***Solvents are 1-methoxy-2-propanol(MeOPrOH), butyl acetate (BuAc) or methoxyethyl ether (diglyme)
****Catalysts are triphenyl phosphine (TPP), N-methylimidazole (NMI) or dibutyl tin dilaurate (DiBSn)
*****FCS amount refers to the amount in grams of 50% SiO$_2$ phenyl functionalized colloidal silica described in Example 2.
******Tg refers to the glass transition temperature as measured by DSC (mid-point of inflection).

EXAMPLE 4

The coefficient of thermal expansion performance of wafer level underfill (WLU) materials was determined. 10 micron films of the material, prepared as per Example 3 were cast on Teflon slabs (with the dimensions 4"×4"×0.25") and dried at 40° C. and 100 mmHg overnight to give a clear hard film, which was then further dried at 85° C. and 150 mmHg. The film was cured according to the method of Example 3 and coefficient of thermal expansion (CTE) values measured by thermal mechanical analysis (TMA). The samples were cut to 4 mm width using a surgical blade and the CTE was measured using a thin film probe on the TMA.

Thermal Mechanical Analysis was performed on a TMA 2950 Thermo Mechanical Analyzer from TA Instruments. Experimental parameters were set at: 0.05 N of force, 5.000 g static weight, nitrogen purge at 100 mL/min, and 2.0 sec/pt sampling interval. The sample was equilibrated at 30° C. for 2 minutes, followed by a ramp of 5.00° C./min to 250.00° C., equilibrated for 2 minutes, then ramped 10.00° C./min to 0.00° C., equilibrated for 2 minutes, and then ramped 5.00° C./min to 250.00° C.

Table 3 below provides the CTE data obtained. The results for the second and third entries in Table 3 were obtained on films that were transparent, in contrast to films generated from the same compositions in which 5 micron fused silica was used. Both the 5 micron fused silica and the functionalized colloidal silica were used at the same loading rate of 50 weight %. Moreover, the reduction in CTE exhibited by these materials (Table 3, second and third entries) over the unfilled resin. (Table 3, entry 1) indicates that the functionalized colloidal silica is effective in reducing resin CTE.

TABLE 3

| Entry # | CTE below $T_g$ ($\mu m/m° C.$) | CTE Above $T_g$ ($\mu m/m° C.$) |
| --- | --- | --- |
| unfilled resin | 70 | 210 |
| Table 2, Entry 1 (TPP level 0.015 g) | 46 | 123 |
| Table 3, Entry 3 (NMI level 0.0075 g) | 40 | 108 |

EXAMPLE 5

Solder wetting and reflow experiments. The following experiments were carried out in order to demonstrate the wetting action of solder bumps in the presence of the wafer level underfill, as prepared in Examples above.

Part A:

Bumped flip chip dies were coated with a layer of the experimental underfill material from Example 3. This underfill coating contained a substantial amount of solvent, about 30%. In order to drive off this solvent, the coated chips were baked in a vacuum oven at 85° C. and 150 mmHg. This resulted in the tip of the solder bumps being exposed, and a transparent B-stage resin layer coated the entire active surface of the chip.

Part B:

To ensure that the wetting ability of the solder bumps was not hindered by the presence of this B-stage layer, a thin coating of flux was applied to a Cu-clad FR-4 coupon (a glass epoxy sheet laminated with copper commercially available from MG Chemicals). The flux (Kester TSF 6522 Tacflux) was applied only in the area where the solder bumps would contact the copper surface. This assembly was then subjected to reflow in a Zepher convection reflow oven (MannCorp). After reflow, the dies were manually sheared off, and inspected for wet-out solder on the copper surface. Molten solder that had wet the copper surface remained adhered to the board, indicating that the wetting ability, in the presence of tacky flux, was not hindered by the B-staged layer of wafer level underfill material.

Part C:

Coated chips were prepared using the methodology described in Part A. These chips were assembled on to a test board, with a daisy chain test pattern. The test board used was a 62 mil thick FR-4 board commercially available from MG Chemicals. The pad finish metallurgy was Ni/Au. Tacky flux (Kester TSF 6522) was syringe dispensed onto the exposed pads on the test board, using a 30 gauge needle tip and an EFD manual dispenser (EFD, Inc.). The dies were placed on the board with the help of an MRSI 505 automatic pick and place machine (Newport/MSRI Corp.). This assembly was then subjected to reflow in a Zepher convection reflow oven. Electrical resistance readings of ~2 ohms (measured with a Fluke multimeter) indicated that the solder had wet the pads in the presence of the wafer level underfill. X-ray analysis of the chip assembly attached to the Cu pads for both a control die and a die coated with the composition of the present disclosure was conducted utilizing an X-ray machine having a MICROFOCUS X-ray tube. The results of the X-ray analysis indicated solder wetting of the Cu pads, in that the solder bumps showed similar solder ball morphology for both the control and experimental resins after reflow.

EXAMPLE 6

Preparation of functionalized colloidal silica (FCS) pre-dispersion. A functionalized. colloidal silica predispersion was prepared by combining the following: 1035 g of iso-propanol (Aldrich) was slowly added by stirring to 675 grams of aqueous colloidal silica (Snowtex OL, Nissan Chemical Company) containing 20–21 weight % of 50 nm particles of SiO2. Subsequently, 17.6 g phenyl trimethoxysilane (PTS) (Aldrich), was added to the stirred mixture. The mixture was then heated to 80° C. for 1–2 hours to afford a pre-dispersion of functionalized colloidal silica that was stored at room temperature.

EXAMPLE 7

Preparation of dispersion of a functionalized colloidal silica in solvents. A round bottom 2000 ml flask was charged with 540 g of each of the pre-dispersions, prepared in Example 6. Additional pre-dispersion compositions are shown in Table 4, below. 1-methoxy-2-propanol (750 g) was then added to each flask. The resulting dispersion of functionalized colloidal silica was vacuum stripped at 60° C. and 60 mmHg to remove about 1 L of solvents. The vacuum was slowly decreased and solvent removal continued with good agitation until the dispersion weight had reached 80 g. The dispersion of phenyl-functionalized colloidal silica contained 50% SiO2 and no precipitated silica. This dispersion was stable at room temperature for more than three months. The results in Table 4 show that a certain level of phenyl functionality is required in order to prepare a concentrated, stable FCS dispersion in 1-methoxy-2-propanol (Dispersions 1–4, 6). A composition from Example 2, Table 1 entry 3 (listed on Table 4 at entry 6) is included for comparison.

TABLE 4

| Entry# | Pre-dispersion Composition (PTS/100 g SiO2) | Final Dispersion Concentration(size) (wt % SiO2) | Dispersion Stability (in methoxypropanol) |
|---|---|---|---|
| 1 | 0.067 m/100 g | 47% SiO2 - 50 nm | Marginally stable |
| 2 | 0.0838 m/100 g | 50% SiO2 - 50 nm | Stable |
| 3 | 0.134/100 g | 50% SiO2 - 50 nm | Stable |
| 4 | 0.268 m/100 g | 50% SiO2 - 50 nm | Stable |
| 5 | 0.134/100 g | 47% SiO2 - 50 nm | Stable |
| 6 | 0.134/100 g | 50% SiO2 - 20 nm | Stable |

EXAMPLE 8

Preparation of a dispersion of functionalized colloidal silica in epoxy resin. A solution combining 5.33 g of epoxy cresol novolac (ECN 195XL-25 available from Sumitomo Chemical Co.), 2.6 g of novolac hardener (Tamanol 758 available from Arakawa Chemical Industries) in 3.0 g of 1-methoxy-2-propanol was heated to about 50° C. A 7.28 g portion of the solution was added, dropwise, to 10.0 g of the FCS dispersion, by stirring at 50° C. (see, Table 4, entry #3, 50% $SiO_2$ in methoxypropanol, above). The clear suspension was cooled and a catalyst solution of N-methylimidazole, 60 microliters of a 50% w/w solution in methoxypropanol was added by stirring. The clear solution was used directly to cast resin films for characterization or stored at −10° C. Additional films were prepared using differing catalysts in various amounts and variations in the epoxy/hardener composition and various FCS dispersions as set forth in Table 5 below which shows final resin compositions.

Films were cast by spreading a portion of the epoxy-silica dispersion on glass plates, and the solvent was removed in vacuum oven at 90 C/200 mm for 1 hour and 90 C/100 mm for an additional hour. The glass plates were removed and the remaining film was a clear and solid B-stage material. In some cases, the dry film was cured at 220° C. for 5 minutes followed by heating at 160° C. for 60 minutes. Glass transition temperature measurements were obtained by Differential Scanning Calorimetry using a commercially available DSC from Perkin Elmer. The results of DSC analysis are set forth below in Table 6.

TABLE 5

| Sample # | Filler* (Wt % SiO2) | Epoxy A (g)** | Epoxy B (g)** | Hardener A (g)*** | Hardener B (g)*** | Methoxy-propanol (g) | Catalyst (%)**** |
|---|---|---|---|---|---|---|---|
| 1 | 0 | ECN(5.3) | — | Tamanol (2.6) | — | 3 | 0.14 |
| 2 | Denka 40 | ECN(5.3) | — | Tamanol (2.6) | — | 3 | 0.14 |
| 3 | Table 4, #6 (50) | ECN(5.3) | — | Tamanol (2.6) | — | 3 | 0.14 |
| 4 | Table 4, #6 (10) | ECN(5.3) | — | Tamanol (2.6) | — | 3 | 0.14 |
| 5 | Table 4, #6 (15) | ECN(5.3) | — | Tamanol (2.6) | — | 3 | 0.14 |
| 6 | Table 4, #1 (20) | ECN(5.3) | — | Tamanol (2.6) | — | 3 | 0.14 |
| 7 | Table 4, #1 (30) | ECN(5.3) | — | Tamanol (2.6) | — | 3 | 0.14 |
| 8 | Table 4, #1 (30) | ECN(5.0) | UVR6105 (0.475) | HRJ (2.6) | — | 3 | 0.14 |
| 9 | Table 4, #1 (60) | ECN(5.0) | UVR6105 (0.475) | HRJ (2.6) | — | 3 | 0.14 |
| 10 | Table 4, #1 (50) | ECN(4.5) | UVR6105 (0.945) | HRJ (2.6) | — | 3 | 0.14 |
| 11 | Table 4, #1 (50) | ECN(4.0) | UVR6105 (1.52) | HRJ (2.6) | — | 3 | 0.14 |
| 12 | Table 4, #5 (10) | ECN(4.9) | — | Tamanol (2.4) | — | 2.7 | 0.14 |
| 13 | Table 4, #5 (20) | ECN(4.9) | — | Tamanol (2.4) | — | 2.7 | 0.14 |
| 14 | Table 4, #5 (30) | ECN(4.9) | — | Tamanol (2.4) | — | 2.7 | 0.14 |
| 15 | Table 4, #5 (40) | ECN(4.9) | — | Tamanol (2.4) | — | 2.7 | 0.14 |
| 16 | Table 4, #5 (50) | ECN(4.9) | — | Tamanol (2.4) | — | 2.7 | 0.14 |
| 17 | Table 4, #5 (50) | ECN (2.2) | DER 732 (0.4) | Tamanol (1.2) | — | 1.4 | 0.14 |
| 18 | Table 4, #5 (50) | ECN (2.2) | DER 736 (0.3) | Tamanol (1.2) | — | 1.4 | 0.14 |
| 19 | Table4, #5 (30) | ECN(2.8) | — | Tamanol (1.1) | Hydroquinone (0.5) | 1.6 | 0.14 |
| 20 | Table 4, #5 (40) | ECN(2.4) | — | Tamanol (0.9) | Hydroquinone (0.5) | 1.3 | 0.14 |
| 21 | Table 4, #5 (30) | ECN(2.8) | — | Tamanol (1.1) | Resorcinol (0.5) | 1.6 | 0.14 |

TABLE 5-continued

| Sample # | Filler* (Wt % SiO2) | Epoxy A (g)** | Epoxy B (g)** | Hardener A (g)*** | Hardener B (g)*** | Methoxy-propanol (g) | Catalyst (%)**** |
|---|---|---|---|---|---|---|---|
| 22 | Table 4, #5 (40) | ECN(2.4) | — | Tamanol (0.9) | Resorcinol (0.5) | 1.3 | 0.14 |

*Filler refers to the weight of $SiO_2$ in the final formulation in the form of functionalized colloidal silica as described in Table 4. The filler specified as Denka is a 5 micron fused silica filler (FB-5LDX) available from Denka Corporation.
**ECN refers to ESCN 195XL-25 available form Sumitomo Chemical Co. Epoxy B is UVR6105, 3-cyclohexenylmethyl-3-cyclohexenylcarboxylate diepoxide available from Dow Chemical Co. DER 732 is a polyglycol diepoxide available from Dow Chemical Co. DER 736 is a polyglycol diepoxide available from Dow Chemical Co.
***Hardeners are Tamanol 758 or HRJ1583 oligomeric resins available from Arakawa Chemical Industries and Schenectady International respectively or monomeric hydroquinone or resorcinol purchased from Aldrich Chemical.
****Catalyst (N-methylimidazole) loading is based on organic components excluding solvent.

EXAMPLE 9

Flow performance of 50 nm Functionalized colloidal silica formulations. Resin films containing lead eutectic solder balls were prepared by casting a film of resin compositions described in Table 5 onto glass slides. Lead eutectic solder balls (25 mil diameter, mp 183° C.) were placed in this film by compressing two glass slides together to insure that the balls were immersed in the resin film. These assemblies were then heated in an oven at 90° C./200 mm for 1 hour and 90° C./100 mm for an additional hour to remove all solvent and convert the resin film into a hard, B-stage film with embedded solder balls. The films, when cooled to ambient temperature were generally hard as noted in Table 6. A test of the resin flow and fluxing capability was performed by placing the glass slide onto copper clad FR-4 circuit board onto which a drop of Kester flux (product TSF-6522 available from the Kester division of Northrup Grumman) had been placed. The glass slide was positioned such that the solder ball/resin film was in contact with the flux. The entire assembly was then placed onto a hot plate that was maintained at 230–240° C. Flow and fluxing performance was considered to be good if the solder balls exhibited collapse and flowed together. In contrast, resins with poor flow and fluxing characteristics prevented solder ball collapse and the original solder ball morphology was clearly evident visually. Good flow and flux performance to enable solder ball melting and collapse is considered to be critical to forming good electrical connections in a device and the test described above is a measure of utility in device fabrication.

The results summarized in Table 6 indicate that films with substantially improved clarity can be prepared with 50 nm functionalized colloidal silica (entries 6, 7 and 12–16) versus compositions based on conventional 5 micron filler (entry 2) although the films while of acceptable clarity are not as clear as with compositions based on 20 nm functionalized colloidal silica (entries 3–5). However, unexpectedly, the addition of small amounts of a cycloaliphatic epoxy monomer, UVR 6105, gives films with excellent clarity even at high loadings of 50 nm functionalized colloidal silica (entries 8–11). Moreover, the results of entries 8–11 show that film hardness is preserved over a range of UVR 6105 levels.

TABLE 6

| Sample # | Material | $T_g$* | B-stage** | Clarity*** | Solder ball collapse**** |
|---|---|---|---|---|---|
| 1 | Table 5, #1 | 190 | hard | Clear | Complete (excellent) |
| 2 | Table 5, #2 | 193 | hard | opaque | Complete (excellent) |
| 3 | Table 5, #3 | 184 | hard | Clear | No collapse, very poor |
| 4 | Table 5, #4 | 185 | hard | Clear | Complete (good) |
| 5 | Table 5, #5 | — | hard | Clear | Marginal, poor |
| 6 | Table 5, #6 | — | hard | Translucent | Complete (excellent) |
| 7 | Table 5, #7 | 180 | hard | Translucent | Marginal, acceptable |
| 8 | Table 5, #8 | 158 | hard | Clear | Complete (excellent) |
| 9 | Table 5, #9 | 153 | hard | Clear | Complete (excellent) |
| 10 | Table 5, #10 | 160 | hard | Clear | Complete (excellent) |
| 11 | Table 5, #11 | 157 | tacky | Clear | Complete (excellent) |
| 12 | Table 5, #12 | 183 | hard | Translucent | Complete (excellent) |
| 13 | Table 5, #13 | 183 | hard | Translucent | Complete (excellent) |
| 14 | Table 5, #14 | 187 | hard | Translucent | Complete (excellent) |
| 15 | Table 5, #15 | 190 | hard | Translucent | Marginal, acceptable |
| 16 | Table 5, #16 | 203 | hard | Translucent | Marginal, poor |
| 17 | Table 5, #17 | 163 | hard | Translucent | Complete (excellent) |
| 18 | Table 5, #18 | 171 | hard | Translucent | Complete (excellent) |
| 19 | Table 5, #19 | 183 | hard | Translucent | Complete (excellent) |
| 20 | Table 5, #20 | 180 | hard | Translucent | Complete (excellent) |
| 21 | Table 5, #21 | 177 | hard | Translucent | Complete (excellent) |
| 22 | Table 5, #22 | 160 | hard | Translucent | Complete (excellent) |

*$T_g$ refers to the glass transition temperature of a given material cured under standard reflow conditions as measured by DSC.
**B-stage corresponds to the state of the film after solvent removal.
***Based on a visual inspection of the film after solvent removal. Clear is used to designate the best clarity, Translucent is used to designate acceptable clarity for this application (i.e. no adverse effects on wafer dicing process) and opaque is used to designate unacceptable clarity.
****Based on visual inspection during and after heating at 200–240° C.

The results of Table 6 indicate that the base resin (entry 1) exhibits good flow as shown by excellent solder ball collapse; however, this resin has an unacceptably high CTE value and would be expected to give poor reliability when used as a wafer level underfill in flip-chip devices. The use of conventional 5 micron filler (entry 2) gives lower CTE while preserving excellent solder ball collapse but leads to a loss of transparency required for wafer dicing operations. The use of 20 nm filled systems gives excellent transparency but leads to a loss in flow as shown by unacceptably poor solder ball collapse (entry 3) at a filler loading comparable to that used with the 5 micron filler. Good solder ball collapse is observed at 10% $SiO_2$ 20 nm filler but not at greater than 15% $SiO_2$ 20 nm filler (entries 3 and 4 respectively). Use of 50 nm filler (Table 4, entries 6 and 7) show a substantial increase in flow as shown by good solder ball collapse at up to 30 weight percent filler. Furthermore, addition of a cycloaliphatic epoxy resin to the formulations provides both a substantial gain in flow as well as better film transparency with a similar result being obtained with addition of aliphatic epoxy resins (Table 6, entries 8–11 and 17–18 respectively). Furthermore, similar improvements in flow are also realized with combinations of 50 mm filler and monomeric hardeners that include some dihydroxy compounds (Table 6, entries 19–22).

EXAMPLE 10

Preparation of difunctional siloxane anhydride. A 500 milliliter (ml) flask equipped with mechanical stirrer, thermometer, condenser, addition funnel and nitrogen inlet was charged with 127 grams (0.77 mols) of 5-norbornene-2,3-dicarboxylic anhydride, 150 grams of toluene and 20 ppm of platinum as Karstedt's catalyst (i.e., a complex of $Pt^0$ with divinyltetramethyldisiloxane as described in U.S. Pat. No. 3,775,442). The solution was heated to 80° C. at which point 84.3 grams (0.4 mols) of 1,1,3,3,5,5-hexamethyltrisiloxane was added drop-wise to the reaction mixture. A mild exotherm took place and the temperature was raised to 100° C. The addition of silicone hydride was completed in 1 hour. The reaction mixture was stirred at 80° C. for an additional hour. Infrared (IR) analysis was conducted using an Avatar 370 FT-IR (from Thermo Electron Corporation); the results showed 75% conversion of Si—H groups. An additional 20 ppm of the platinum catalyst was added and the reaction mixture was heated to 80° C. with stirring under nitrogen over night. The next morning, IR analysis was again conducted; the results showed more than 99% consumption of Si—H. At that point the reaction mixture was cooled to room temperature.

The cooled reaction mixture was then mixed with 300 ml of hexane. A precipitation of white powder was observed. The solid material was separated by filtration and dried in vacuum oven at 50° C. to afford 180 grams of the desired difunctional siloxane anhydride. $^1H$, $^{29}Si$ NMR was conducted using a 400 MHz Bruker Avance 400 which confirmed both the structure and purity of the anhydride.

EXAMPLE 11

Preparation of functionalized colloidal silica pre-dispersion. A functionalized colloidal silica pre-dispersion was prepared using the following procedure. 465 grams of aqueous colloidal silica (Nalco 1034A, Nalco Chemical Company) containing about 34 weight % of 20 nm particles of silica, was mixed with 800 grams of isopropanol (Aldrich) and 56.5 grams of phenyltrimethoxy silane (Aldrich) by stirring. The mixture was heated to 60–70° C. for 2 hours to give a clear suspension. The resulting pre-dispersion was cooled to room temperature and stored in a glass bottle.

EXAMPLE 12

Preparation of resin containing stabilized functionalized colloidal silica. A 1000-milliliter (ml) flask was charged with 300 grams of the colloidal silica pre-dispersion from Example 11, 150 grams of 1-methoxy-2-propanol (Aldrich) as solvent and 0.5 grams of crosslinked polyvinylpyridine. The mixture was stirred at 70° C. After 1 hour the suspension was blended with 4 grams Celite® 545 (a commercially available diatomaceous earth filtering aid), cooled down to room temperature and filtered. The resulting dispersion of functionalized colloidal silica was blended with 30 grams of 3,4-epoxycyclohexylmethyl-3,4-epoxycyclohexane carboxylate (UVR6105 from Dow Chemical Company) and 10 grams of bisphenol-F epoxy resins (RSL-1739 from Resolution Performance Product) and vacuum stripped at 75° C. at 1 Torr to constant weight to yield 88.7 grams of a viscous liquid resin.

EXAMPLE 13

Preparation of epoxy fluxing compositions. 5 grams of the functionalized colloidal silica resin of Example 12 was blended at room temperature with 1.56 grams of 4-methylhexahydrophthalic anhydride (MHHPA) (from Aldrich) and 1.56 grams of 5,5'-(1,1,3,3,5,5-hexamethyl-1,5,trisiloxanediyl)bis[hexahydro-4,7-Methanoisobenzofuran-1,3-dione] (TriSDA) (the difunctional siloxane anhydride product of Example 10). 0.01 grams of catalyst (Polycat SA-1 from Air Products) and 0.07 grams of γ-glycidoxypropyltrimethoxysilane (GE Silicones) were added at room temperature. The formulations were blended at room temperature for approximately 10 minutes after which time the formulation was degassed at high vacuum at room temperature for 20 minutes. The resulting materials were stored at −40° C.

EXAMPLE 14

Chip coating procedure. Silicon die and quartz die were coated with the wafer level underfill material described above in Table 2, entry 9 of Example 3. The silicon die was a perimeter array PB08 with 8 mil pitch, nitride passivation, diced from a wafer purchased from Delphi Delco Electronics. The quartz die was a perimeter array, 8 mil pitch, diced from a wafer purchased from Practical Components. The underfill material was printed onto individual die using a mask fixture such that the tops of the solder balls were covered. A B-stage process was carried out by placing the coated die in a vacuum oven so that the die were subjected to a surface temperature of 95° C. and vacuum of 200 mm Hg for one hour, followed by an additional one hour at 100 mm Hg. The die were then removed from the oven and allowed to cool to room temperature.

A copper clad FR4 board (commercially available from MG Chemicals) was cleaned by sanding with 180 grit paper followed by thorough cleaning with isopropanol and a lint free cloth. Two different fluxing resins were examined. In each case a center dot dispense of fluxing agent was applied to the clean board using an EFD 1000 series dispenser followed by placement of the quartz coated die. The test assembly was then passed through a Zepher convection reflow oven using a typical reflow profile: the maximum temperature rising slope was 2.1° C./second; the time between 130° C. and 160° C. was 53 seconds; the temperature rising time above 160° C. was 120 seconds; the time between 160° C. and 183° C. was 74 seconds; and the time above 183° C. was 70 seconds, with a maximum temperature of 216° C. followed by a temperature decrease of 2.5° C. per second.

Three chip/board assemblies were prepared. For the first assembly, a tacky flux (Kester TSF 6522 Tacflux) was dispensed on the FR4 copper clad board and utilized as the fluxing agent. A quartz die coated with the wafer level underfill composition described above in Table 2, entry 9 of Example 3 was then applied to the fluxing resin and subjected to reflow. Examination of this assembly after reflow showed extensive, unacceptable voiding although good solder wetting was noted.

For the second assembly, the fluxing resin of Example 13 above was dispensed on the FR4 copper clad board. A quartz die coated with the wafer level underfill composition described above in Table 2, entry 9 of Example 3 was then applied to the fluxing resin and subjected to reflow. Examination after reflow of this assembly showed no voiding and evidence of excellent adhesion.

For the third assembly, the fluxing resin of Example 13 above was dispensed on the FR4 copper clad board. A silicon die coated with the wafer level underfill composition described above in Table 2, entry 9 of Example 3 was then applied to the fluxing resin and the assembly subjected to reflow. Examination after reflow of this assembly showed evidence of excellent adhesion. Removal of the die showed no voiding was present. This example demonstrates the benefit of using solvent-modified epoxy resin in producing B-stage resin films, in combination with a second fluxing resin to produce void-free, high adhesion, conductive chip assemblies.

Although preferred and other embodiments of the disclosure have been described herein, further embodiments may be perceived by those skilled in the art without departing from the scope of the disclosure as defined by the following claims.

The invention claimed is:

1. An underfill composition comprising:
a first curable transparent resin composition comprising an aromatic epoxy resin in combination with a solvent, a functionalized colloidal silica dispersion, and at least one other component selected from the group consisting of cycloaliphatic epoxy monomers, aliphatic epoxy monomers, hydroxy aromatic compounds and combinations and mixtures thereof; and
a second curable fluxing composition comprising at least one epoxy resin,
wherein the second curable fluxing composition further comprises at least one epoxy hardener, and
wherein the at least one epoxy hardener comprises a difunctional siloxane anhydride of the formula:

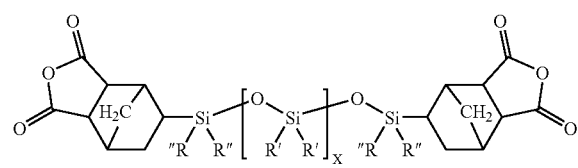

(3)

where X is from 0 to 50 inclusive, and each R' and R" are independently selected from the group consisting of $C_{1-22}$ alkyl, $C_{1-22}$ alkoxy, $C_{2-22}$ alkenyl, $C_{6-14}$ aryl, $C_{6-22}$ alkyl-substituted aryl, and $C_{6-22}$ arylalkyl.

2. The underfill composition of claim 1, wherein the at least one difunctional siloxane anhydride comprises a mixture of oligomers of formula (3) and wherein X in formula (3) is from 0 to 10 inclusive.

3. The underfill composition of claim 1, further comprising at least one anhydride epoxy hardener selected from the group consisting of methylhexahydrophthalic anhydride (MHHPA), methyltetrahydrophthalic anhydride, 1,2-cyclohexanedicarboxylic anhydride, bicyclo[2.2.1]hept-5-ene-2,3-dicarboxylic anhydride, methylbicyclo[2.2.1]hept-5-ene-2,3-dicarboxylic anhydride, phthalic anhydride, pyromellitic dianhydride, hexahydrophthalic anhydride, dodecenylsuccinic anhydride, dichloromaleic anhydride, chlorendic anhydride, tetrachlorophthalic anhydride, and mixtures thereof.

4. The underfill composition of claim 1, further comprising a liquid epoxy hardener selected from the group consisting of methylhexahydrophthalic anhydride, hexahydrophthalic anhydride, and tetrahydrophthalic anhydride.

5. An underfill composition comprising
a first curable transparent resin composition comprising at least one aromatic epoxy resin in combination with at least one solvent, a functionalized colloidal silica dispersion having a particle size of about 50 nm to about 100 nm, and at least one additional component selected from the group consisting of cycloaliphatic epoxy monomers, aliphatic epoxy monomers, hydroxy aromatic compounds, and combinations and mixtures thereof; and
a second curable fluxing composition comprising at least one epoxy resin in combination with at least one epoxy hardener,
wherein the at least one epoxy hardener comprises a difunctional siloxane anhydride of the formula:

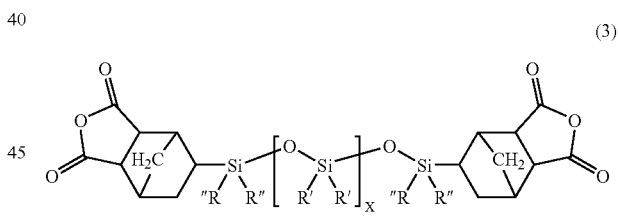

(3)

where X is from 0 to 50 inclusive, and each R' and R" are independently selected from the group consisting of $C_{1-22}$ alkyl, $C_{1-22}$ alkoxy, $C_{2-22}$ alkenyl, $C_{6-14}$ aryl, $C_{6-22}$ alkyl-substituted aryl, and $C_{6-22}$ arylalkyl.

6. The underfill composition of claim 5, wherein the at least one difunctional siloxane anhydride comprises a mixture of oligomers of formula (3) and wherein X in formula (3) is from 0 to 10 inclusive.

7. The underfill composition of claim 5, further comprising at least one anhydride epoxy hardener selected from the group consisting of methylhexahydrophthalic anhydride (MHHPA), methyltetrahydrophthalic anhydride, 1,2-cyclohexanedicarboxylic anhydride, bicyclo[2.2.1]hept-5-ene-2,3-dicarboxylic anhydride, methylbicyclo[2.2.1]hept-5-ene-2,3-dicarboxylic anhydride, phthalic anhydride, pyromellitic dianhydride, hexahydrophthalic anhydride, dodecenylsuccinic anhydride, dichloromaleic anhydride, chlorendic anhydride, tetrachlorophthalic anhydride, and mixtures thereof.

8. The underfill composition of claim 5, further comprising a liquid epoxy hardener selected from the group consisting of methylhexahydrophthalic anhydride, hexahydrophthalic anhydride, and tetrahydrophthalic anhydride.

9. An underfill composition comprising
a first curable transparent epoxy resin comprising a cresol novolac epoxy resin in combination with at least one solvent, a functionalized colloidal silica dispersion having a particle size of about 50 nm to about 100 nm, and at least one additional component selected from the group consisting of cycloaliphatic epoxy monomers, aliphatic epoxy monomers, hydroxy aromatic compounds, and combinations and mixtures thereof; and
a second curable fluxing composition comprising at least one epoxy resin in combination with at least one difunctional siloxane anhydride epoxy hardener of the formula:

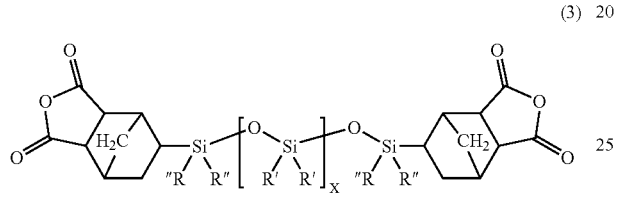
(3)

where X is from 0 to 50 inclusive, and each R' and R" are independently selected from the group consisting of $C_{1-22}$ alkyl, $C_{1-22}$ alkoxy, $C_{2-22}$ alkenyl, $C_{6-14}$ aryl, $C_{6-22}$ alkyl-substituted aryl, and $C_{6-22}$ arylalkyl.

10. A solid state device comprising:
a chip;
a substrate; and
an underfill composition between the chip and the substrate comprising a first curable transparent resin composition comprising at least one aromatic epoxy resin in combination with at least one solvent, a functionalized colloidal silica dispersion having a particle size of about 50 nm to about 100 nm, and at least one additional component selected from the group consisting of cycloaliphatic epoxy monomers, aliphatic epoxy monomers, hydroxy aromatic compounds and combinations and mixtures thereof; and
a second curable fluxing composition comprising at least one epoxy resin in combination with at least one epoxy hardener,
wherein the at least one epoxy hardener comprises a difunctional siloxane anhydride epoxy hardener of the formula:

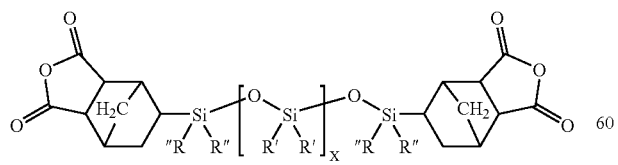
(3)

where X is from 0 to 50 inclusive, and each R' and R" are independently selected from the group consisting of $C_{1-22}$ alkyl, $C_{1-22}$ alkoxy, $C_{2-22}$ alkenyl, $C_{6-14}$ aryl, $C_{6-22}$ alkyl-substituted aryl, and $C_{6-22}$ arylalkyl.

11. The solid state device of claim 10, further comprising at least one anhydride epoxy hardener selected from the group consisting of methylhexahydrophthalic anhydride (MHHPA), methyltetrahydrophthalic anhydride, 1,2-cyclohexanedicarboxylic anhydride, bicyclo[2.2.1]hept-5-ene-2,3-dicarboxylic anhydride, methylbicyclo[2.2.1]hept-5-ene-2,3-dicarboxylic anhydride, phthalic anhydride, pyromellitic dianhydride, hexahydrophthalic anhydride, dodecenylsuccinic anhydride, dichloromaleic anhydride, chlorendic anhydride, tetrachlorophthalic anhydride, and mixtures thereof.

12. The solid state device of claim 10, further comprising a liquid epoxy hardener selected from the group consisting of methylhexahydrophthalic anhydride, hexahydrophthalic anhydride, and tetrahydrophthalic anhydride.

13. A method for producing a solid state device comprising:
applying to a chip a first curable transparent resin composition comprising an aromatic epoxy resin in combination with a solvent, a functionalized colloidal silica dispersion, and at least one other component selected from the group consisting of cycloaliphatic epoxy monomers, aliphatic epoxy monomers, hydroxy aromatic compounds and combinations and mixtures thereof, to produce a coated chip;
applying a second curable fluxing composition comprising at least one epoxy resin in combination with at least one epoxy hardener to a substrate;
placing the coated chip on a portion of the substrate to which the fluxing composition has been applied; and
curing the first curable transparent resin composition and second curable fluxing composition to form an underfill composition.

14. The method of claim 13 wherein the step of applying the first curable transparent resin composition further comprises applying a first curable transparent resin having colloidal silica possessing a particle size of between about 20 nm and about 100 nm.

15. The method of claim 13 wherein the step of applying the first curable transparent resin composition further comprises removing the solvent to form a hard, transparent B-stage resin film on the chip.

16. The method of claim 13 wherein the step of applying the second curable fluxing composition to the substrate further comprises applying an epoxy resin in combination with at least one epoxy hardener comprising a difunctional siloxane anhydride of the formula:

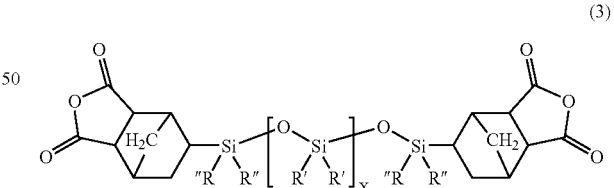
(3)

where X is from 0 to 50 inclusive, and each R' and R" are independently selected from the group consisting of $C_{1-22}$ alkyl, $C_{1-22}$ alkoxy, $C_{2-22}$ alkenyl, $C_{6-14}$ aryl, $C_{6-22}$ alkyl-substituted aryl, and $C_{6-22}$ arylalkyl.

17. The method of claim 13 wherein the step of applying the second curable fluxing composition to the substrate comprises applying a second curable fluxing composition which further comprises a colloidal silica dispersion functionalized with at least one organoalkoxysilane and having a particle size of between about 5 nm and about 200 nm.

* * * * *